(12) United States Patent
Yamawaku

(10) Patent No.: US 11,578,407 B2
(45) Date of Patent: Feb. 14, 2023

(54) FILM-FORMING APPARATUS AND FILM-FORMING METHOD

(71) Applicant: TOKYO ELECTRON LIMITED, Tokyo (JP)

(72) Inventor: Jun Yamawaku, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/056,342

(22) PCT Filed: Apr. 9, 2019

(86) PCT No.: PCT/JP2019/015389
§ 371 (c)(1),
(2) Date: Nov. 17, 2020

(87) PCT Pub. No.: WO2019/225184
PCT Pub. Date: Nov. 28, 2019

(65) Prior Publication Data
US 2021/0222296 A1    Jul. 22, 2021

(30) Foreign Application Priority Data

May 21, 2018 (JP) .............................. JP2018-097404

(51) Int. Cl.
*H01J 37/32* (2006.01)
*C23C 16/455* (2006.01)
(Continued)

(52) U.S. Cl.
CPC .... *C23C 16/45536* (2013.01); *C23C 16/4412* (2013.01); *C23C 16/45548* (2013.01);
(Continued)

(58) Field of Classification Search
CPC .......... C23C 16/45536; C23C 16/4412; C23C 16/45548; C23C 16/45565; C23C 16/509;
(Continued)

(56) References Cited

U.S. PATENT DOCUMENTS 6,830,007 B2 * 12/2004 Matsuki ................ C23C 16/401
156/345.43
7,329,608 B2 * 2/2008 Babayan ................ H01L 51/524
438/689
(Continued)

FOREIGN PATENT DOCUMENTS

CN    103053011 A    4/2013
CN    107431012 A    12/2017
(Continued)

OTHER PUBLICATIONS

PCT International Search Report and Written Opinion, PCT Application No. PCT/JP2019/015389, dated Jun. 11, 2019, 12 pages (with English translation of International Search Report).

*Primary Examiner* — Rudy Zervigon
(74) *Attorney, Agent, or Firm* — Fenwick & West LLP

(57) ABSTRACT

A film-forming apparatus for forming a predetermined film on a substrate by plasma ALD includes a chamber, a stage, a shower head having an upper electrode and a shower plate insulated from the upper electrode, a first high-frequency power supply connected to the upper electrode, and a second high-frequency power supply connected to an electrode contained in the stage. A high-frequency power is supplied from the first high-frequency power supply to the upper electrode, thereby forming a high-frequency electric field between the upper electrode and the shower plate and generating a first capacitively coupled plasma. A high-frequency power is supplied from the second high-frequency power supply to the electrode, thereby forming a high-frequency electric field between the shower plate and the
(Continued)

electrode in the stage and generating a second capacitively coupled plasma that is independent from the first capacitively coupled plasma.

7 Claims, 11 Drawing Sheets

(51) Int. Cl.
  *C23C 16/44* (2006.01)
  *C23C 16/509* (2006.01)
  *H01L 21/3065* (2006.01)
  *H01L 21/67* (2006.01)
  *C23C 16/56* (2006.01)

(52) U.S. Cl.
  CPC ...... *C23C 16/45565* (2013.01); *C23C 16/509* (2013.01); *H01L 21/3065* (2013.01); *H01L 21/67011* (2013.01); *C23C 16/56* (2013.01)

(58) Field of Classification Search
  CPC . C23C 16/56; C23C 16/045; C23C 16/45542; C23C 16/5096; C23C 16/452; C23C 16/4401; C23C 16/515; C23C 16/517; C23C 16/45523; C23C 16/45527; H01L 21/3065; H01L 21/67011; H01L 21/02186; H01L 21/02274; H01L 21/0228; H01L 21/67103; H01J 37/32091; H01J 37/32165; H01J 37/32357; H01J 37/32422; H01J 37/3244; H01J 37/32568; H01J 37/32174; H01J 37/32871
  USPC ...... 118/723 E, 723 ER, 679, 682, 695, 696, 118/697, 698, 699, 702; 156/345.43, 156/345.47; 427/569, 570; 216/71
  See application file for complete search history.

(56) References Cited

U.S. PATENT DOCUMENTS

| | | | | |
|---|---|---|---|---|
| 7,695,590 B2* | 4/2010 | Hanawa | ................ | C23C 14/358 156/345.43 |
| 8,609,199 B2* | 12/2013 | Yamazaki | ............... | B82Y 40/00 427/535 |
| 8,790,785 B2* | 7/2014 | Yamamoto | ........ | H01L 21/02274 427/255.6 |
| 8,980,379 B2* | 3/2015 | Hanawa | ............ | H01L 21/67115 427/248.1 |
| 9,373,517 B2* | 6/2016 | Yang | ..................... | C23C 16/503 |
| 10,032,606 B2* | 7/2018 | Yang | ................ | H01L 21/67069 |
| 10,424,464 B2* | 9/2019 | Xu | .................... | H01J 37/32082 |
| 2001/0006093 A1* | 7/2001 | Tabuchi | ............ | H01J 37/32715 156/345.43 |
| 2003/0106643 A1* | 6/2003 | Tabuchi | ............. | H01J 37/32715 156/345.46 |
| 2005/0126487 A1* | 6/2005 | Tabuchi | ............. | H01J 37/32357 118/723 E |
| 2006/0021701 A1* | 2/2006 | Tobe | ................. | H01J 37/32357 156/345.31 |
| 2006/0042752 A1* | 3/2006 | Rueger | ............ | H01L 21/02274 156/345.1 |
| 2006/0260750 A1* | 11/2006 | Rueger | ............ | H01L 21/02164 156/345.35 |
| 2009/0246538 A1* | 10/2009 | Yamamoto | .......... | H01L 21/7682 556/460 |
| 2010/0209704 A1* | 8/2010 | Yamazaki | ............... | C01B 32/16 427/535 |
| 2013/0059448 A1* | 3/2013 | Marakhtanov | .... | H01J 37/32146 438/711 |
| 2014/0057447 A1* | 2/2014 | Yang | .................... | C23C 16/509 438/711 |
| 2014/0273487 A1* | 9/2014 | Deshmukh | .......... | H01L 21/6875 156/345.43 |
| 2015/0332893 A1* | 11/2015 | Tabuchi | ................ | C23C 16/452 118/723 R |
| 2016/0300694 A1* | 10/2016 | Yang | ................... | H01L 21/3065 |
| 2018/0308687 A1* | 10/2018 | Smith | ............... | C23C 16/45525 |
| 2022/0028697 A1* | 1/2022 | Tan | .................. | H01L 21/67748 |

FOREIGN PATENT DOCUMENTS

| | | |
|---|---|---|
| CN | 107564790 A | 1/2018 |
| JP | 2009-521594 A | 6/2009 |
| JP | 2012-134288 A | 7/2012 |
| JP | 2012-517711 A | 8/2012 |
| JP | 2015-099866 A | 5/2015 |
| JP | 2016-167606 A | 9/2016 |
| JP | 2018-011050 A | 1/2018 |
| JP | 2018-064058 A | 4/2018 |
| TW | 201105813 A | 2/2011 |
| TW | I608544 B | 12/2017 |
| WO | WO 2007/061633 A2 | 5/2007 |
| WO | WO 2010/092482 A2 | 8/2010 |

\* cited by examiner

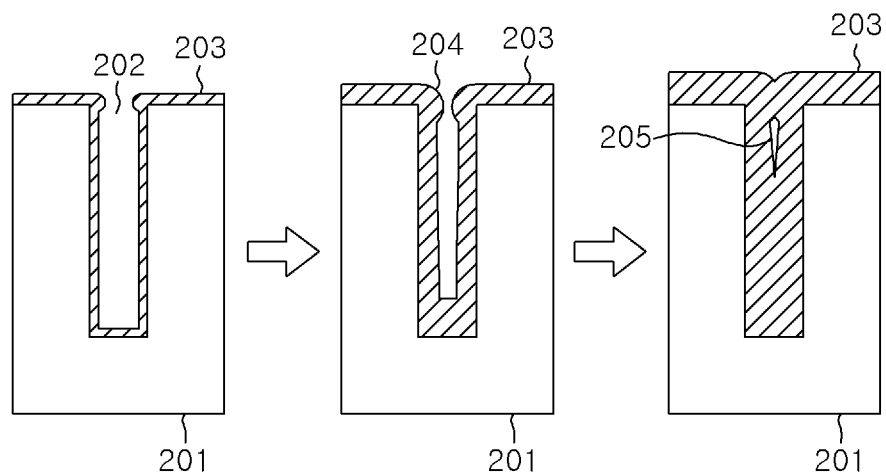
FIG.7A <Related Art>  FIG.7B <Related Art>  FIG.7C <Related Art>
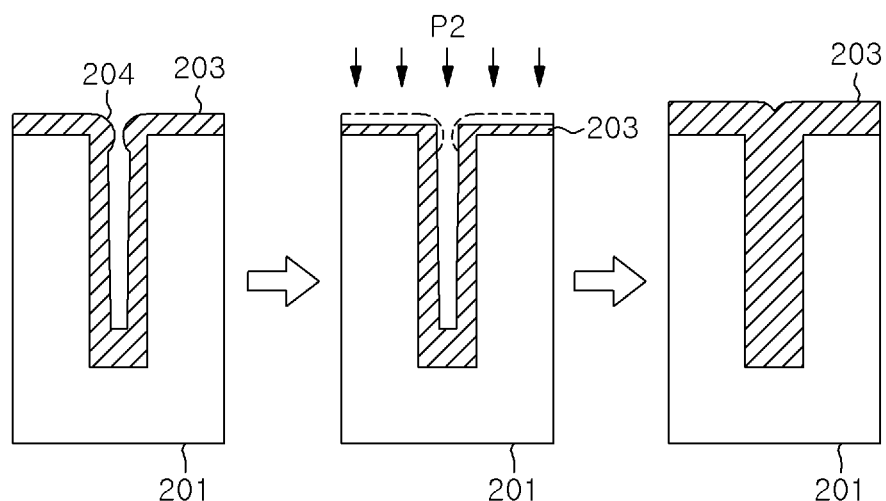
FIG.8A  FIG.8B  FIG.8C

FIG.9A
<Related Art>
FIG.9B
<Related Art>
FIG.9C
<Related Art>
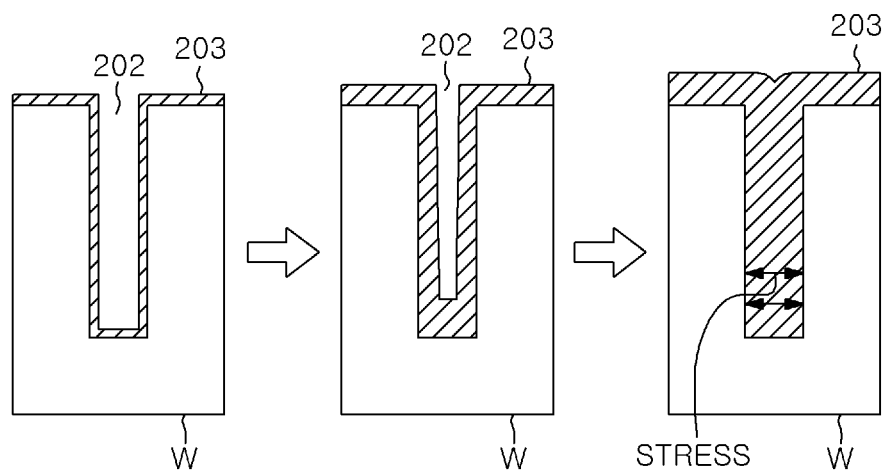
FIG.10A   FIG.10B   FIG.10C
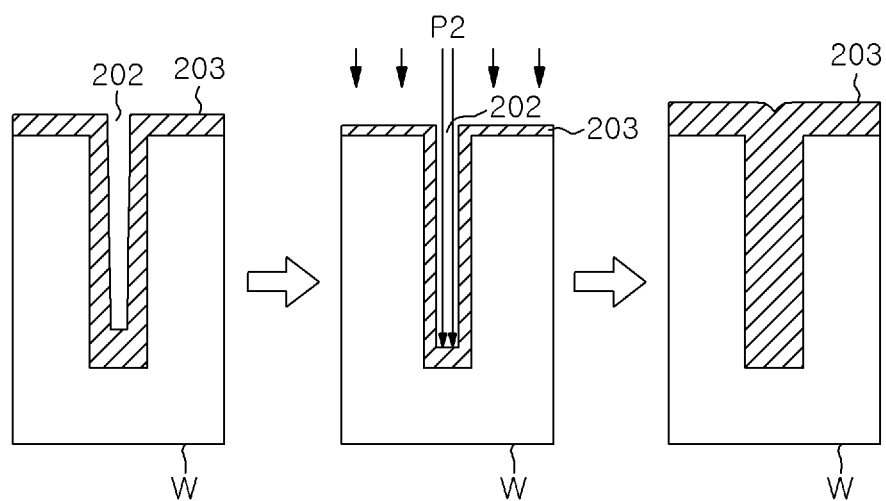

FILM-FORMING APPARATUS AND FILM-FORMING METHOD

TECHNICAL FIELD

The present disclosure relates to a film-forming apparatus and a film-forming method.

BACKGROUND

Recently, the miniaturization of semiconductor devices is in progress, and an atomic layer deposition (ALD) method in which a predetermined film is formed one atomic layer at a time is known as a film forming technique suitable for formation of a fine pattern. Also, a plasma ALD (plasma enhanced atomic layer deposition (PEALD)) for improving reactivity of a gas to be used and lowering a processing temperature has recently attracted attention (see, e.g., Patent Document 1).

Further, as a technique for burying a film in a fine trench without generating a void, there is known a HDP-CVD method in which film formation and etching are performed simultaneously by applying a bias power to a substrate in a chamber where an ICP high-density plasma, an ECR high-density plasma, or the like can be generated (see, e.g., Patent Document 2).

RELATED ART

Patent Document 1: Japanese Patent Application Publication No. 2009-521594
Patent Document 2: Japanese Patent Application Publication No. 2012-134288

The present disclosure provides a film-forming apparatus and a film-forming method capable of performing film formation using PEALD while coping with a progressive miniaturization of semiconductor devices.

SUMMARY

In accordance with an aspect of the present disclosure, there is provided a film-forming apparatus for forming a predetermined film on a substrate by plasma ALD, the film-forming apparatus including: a chamber accommodating a substrate; a stage configured to support the substrate in the chamber; a shower head disposed to be opposed to the stage and having a conductive upper electrode and a conductive shower plate insulated from the upper electrode, the shower head being configured to supply a gas including a film forming source gas for film formation and a reactant gas; an electrode contained in the stage; a first high-frequency power supply connected to the upper electrode; and a second high-frequency power supply connected to the electrode contained in the stage. Further, a high-frequency power is supplied from the first high-frequency power supply to the upper electrode, thereby forming a high-frequency electric field between the upper electrode and the shower plate and generating a first capacitively coupled plasma. Further, a high-frequency power is supplied from the second high-frequency power supply to the electrode in the stage, thereby forming a high-frequency electric field between the shower plate and the electrode in the stage and generating a second capacitively coupled plasma independently of the first capacitively coupled plasma.

Effect of the Invention

In accordance with an aspect of the present disclosure, a film-forming apparatus and a film-forming method capable of performing film formation using PEALD while coping with a progressive miniaturization of semiconductor devices are provided.

BRIEF DESCRIPTION OF THE DRAWINGS

FIGS. 7A to 7C are process cross-sectional views for explaining a state in which an opening of a recess is blocked when a film is buried in the recess by conventional PEALD.

FIGS. 8A to 8C are process cross-sectional views for explaining a state in which an opening of a recess is prevented from being blocked in the case of burying a film in the recess by PEALD using the film-forming apparatus according to the embodiment.

FIGS. 9A to 9C are process cross-sectional views for explaining stress generated at a buried film in the case of forming a film in a recess by conventional PEALD.

FIGS. 10A to 10C are process cross-sectional views for explaining that film stress can be adjusted by burying a film in a recess by PEALD using the film-forming apparatus according to the embodiment.

DETAILED DESCRIPTION

Hereinafter, embodiments will be described with reference to the accompanying drawings.

Figure 1:
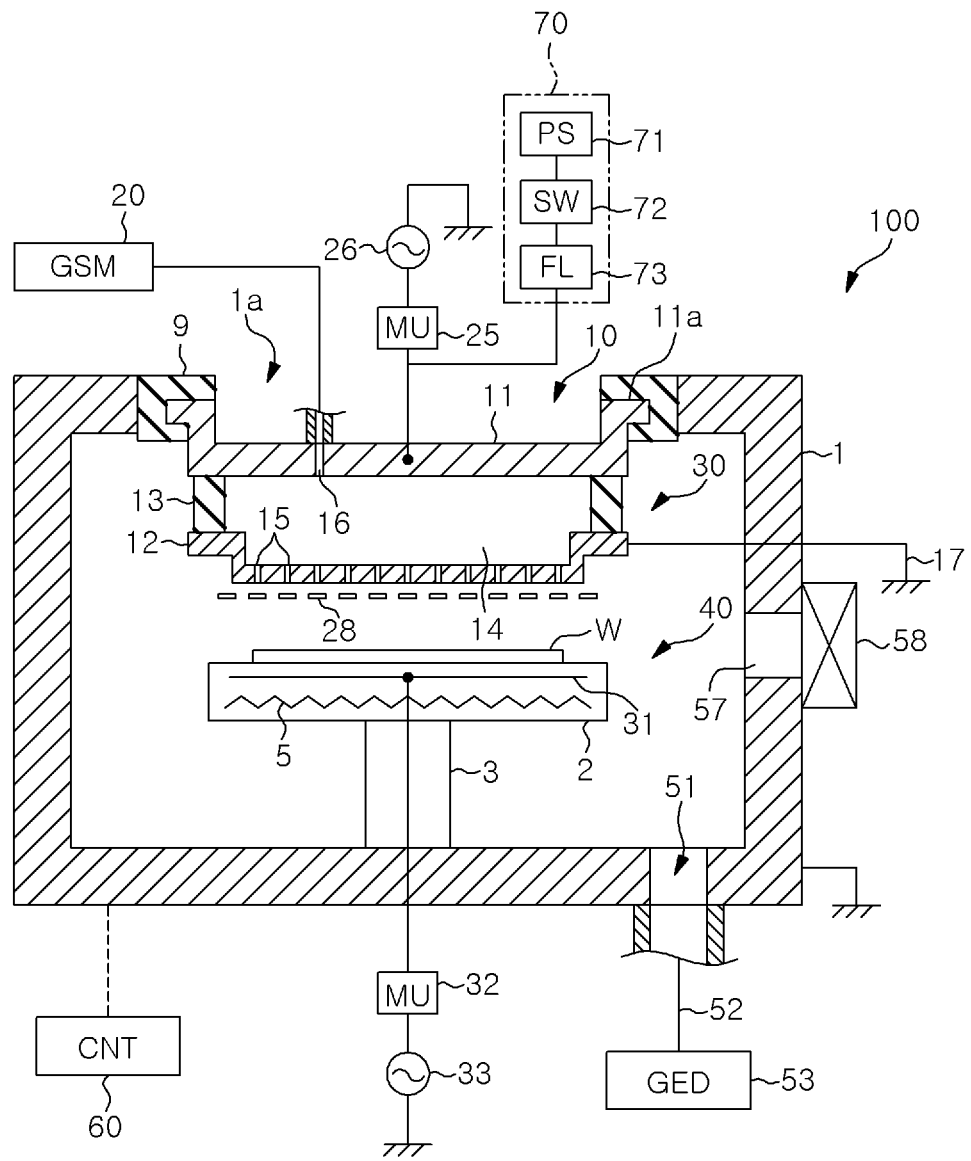
FIG. 1 is a schematic cross-sectional view showing a film-forming apparatus according to an embodiment.

FIG. 1 is a schematic cross-sectional view showing a film-forming apparatus according to an embodiment.

A film-forming apparatus 100 is configured as a capacitively coupled plasma processing apparatus and has a function of etching and a function of forming a predetermined film on a substrate W by plasma enhanced atomic layer deposition (PEALD). The substrate W may be, e.g., a semiconductor wafer, but is not limited thereto.

The film-forming apparatus 100 includes a substantially cylindrical chamber 1. The chamber 1 is frame-grounded. A stage 2 for horizontally supporting the substrate W is disposed in the chamber 1. The stage 2 is made of insulating ceramic such as AlN, and a central bottom portion of the stage 2 is supported by a cylindrical support member 3 that is made of insulating ceramic and extends vertically from the bottom of the chamber 1. Further, a heater 5 made of a refractory metal such as molybdenum is embedded in the stage 2. The heater is configured to heat the substrate W placed on the stage 2 to a predetermined temperature by power supplied from a heater power supply (not shown). Alternatively, the stage 2 may be made of a conductor.

Further, although it is not illustrated, a plurality of lift pins is inserted into the stage 2 to protrude beyond and retract below an upper surface of the stage 2 by a lifting mechanism. The substrate W is transferred onto the stage 2 by raising and lowering the lift pins.

The chamber 1 has a top opening 1a at a ceiling wall thereof, and a shower head 10 is fitted in the opening 1a together with an insulating member 9. The shower head 10 is formed in a cylindrical shape as a whole. The shower head 10 includes an upper electrode 11 that is an upper plate, a shower plate 12 forming a bottom surface of the shower head 10, and a cylindrical insulating member 13 disposed between the upper electrode 11 and the shower plate 12. The upper electrode 11 and the shower plate 12 are made of a conductive material. The shower head 10 has therein a gas diffusion space 14. The upper electrode 11 has a flange portion 11a at an outer periphery of thereof, and the flange portion 11a is supported by the insulating member 9. The shower plate 12 has a plurality of gas injection holes 15, and the upper electrode 11 has a gas inlet hole 16. The gas inlet hole 16 is connected to a gas line of a gas supply mechanism (GSM) 20 for supplying a film forming gas.

The gas supply mechanism 20 is configured to supply a gas used for PEALD film formation, for example, a film forming source gas containing a constituent element of a film to be formed, a reactant gas that reacts with the film forming source gas, a purge gas, and the like. Gas lines for supplying such gases are provided with valves and flow rate controllers such as mass flow controllers. Various gases may be used as the film forming source gas and the reactant gas depending on a film to be filmed. The purge gas may be an inert gas such as a noble gas, for example, Ar gas or He gas, or the purge gas may be $N_2$ gas. During film formation, the film forming source gas and the reactant gas are alternately and intermittently supplied while supplying the purge gas. When the reactant gas reacts with the film forming source gas only in a state where plasma is generated, the reactant gas may be supplied continuously during the film formation.

A first high-frequency power supply 26 is connected to the upper electrode 11 of the shower head 10 through a first matching unit (MU) 25 and configured to supply a high-frequency power to the upper electrode 11. A frequency of the high-frequency power of the first high-frequency power supply 26 is preferably in a range of 450 kHz to 40 MHz, and is typically 13.56 MHz. On the other hand, the shower plate 12 is connected to a ground line 17 and is grounded. The upper electrode 11 and the shower plate 12 are insulated from each other by the insulating member 13 and form a pair of parallel plate electrodes. The upper electrode 11, the shower plate 12, and the first high-frequency power supply 26 constitute a first capacitively coupled plasma generation unit 30.

In the first capacitively coupled plasma generation unit 30, a high-frequency electric field is formed between the upper electrode 11 and the shower plate 12 by applying the high-frequency power from the first high-frequency power supply 26, thereby generating a first capacitively coupled plasma in the gas diffusion space 14.

The first matching unit 25 matches a load impedance with an internal (or output) impedance of the first high-frequency power supply 26. The first matching unit 25 functions such that the output impedance of the first high-frequency power supply 26 and the load impedance apparently match when plasma is generated in the gas diffusion space 14.

The first capacitively coupled plasma generation unit 30 is configured as a remote plasma source for PEALD. In other words, the reactant gas is dissociated by the first capacitively coupled plasma generated in the gas diffusion space 14, and radicals generated by the dissociation of the reactant gas are mainly supplied to the substrate W on the stage 2 through the gas injection holes 15 and used for film formation by PEALD. During the PEALD process, the first capacitively coupled plasma generation unit 30 intermittently ignites the plasma at a timing when the film forming source gas is not supplied, and dissociates the reactant gas.

Further, a DC pulse application unit 70 is connected to the upper electrode 11. The DC pulse application unit 70 includes a DC power supply (PS) 71, a DC pulse switch (SW) 72, and a filter (FL) 73. The DC pulse application unit 70 may be used instead of, or together with, the first high-frequency power supply 26. When the DC pulse application unit 70 is used together with the first high-frequency power supply 26, the high-frequency power from the first high-frequency power supply 26 and the DC pulse voltage from the DC pulse application unit 70 are superimposed. Since the DC pulse power supply 71 is configured to apply a voltage from zero to a positive pulse or a voltage from zero to a negative pulse, it is possible to apply a power suitable for the characteristics (polarity) of the gas. Accordingly, the dissociation of gas can be further promoted.

Further, an ion trap 28 for trapping ions in the plasma is disposed directly below the shower plate 12. For ions in the plasma, a part of the ions is deactivated in the gas injection holes 15 of the shower plate 12, so that a small amount of ions is supplied to the substrate W. However, the ions passing through the shower plate 12 can be further removed by the ion trap 28. The ion trap 28 may be made of a conductor or an insulator. Alternatively, the ion trap 28 may be formed by embedding a conductor in an insulator. The ion trap 28 made of a conductor may be grounded or in a floating state. If a sufficiently small amount of ions in the plasma pass through the shower plate 12, it is unnecessary to provide the ion trap 28.

Figure 2:
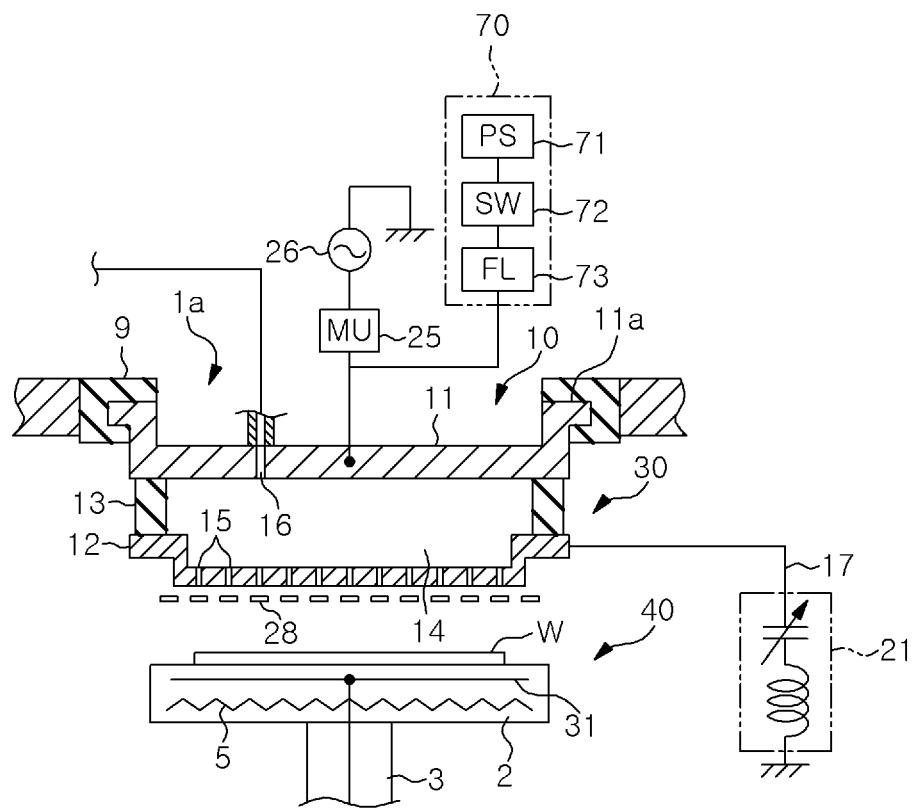
FIG. 2 is a schematic cross-sectional view showing a part of a modification of the film-forming apparatus shown in FIG. 1.

Further, as shown in FIG. 2, the amount of ions passing through the shower plate 12 can be controlled by an impedance adjusting circuit 21 that is disposed on the ground line 17 and having a coil and a capacitor. Since the impedance adjusting circuit 21 is provided to adjust an impedance, it is possible to change a plasma generation position to a position under the shower plate 12. By changing the plasma generation position to the position under the shower plate 12, it is possible to further widen an adjustment range such as a density of capacitively coupled plasma generated between the stage 2 and the shower plate 12, which will be described later.

Inside of the stage 2, an electrode 31 is embedded. That is, the electrode 31 is contained in the stage 2. When the stage 2 is made of a conductor, the stage 2 itself functions as the electrode 31. A second high-frequency power supply 33 is connected to the electrode 31 through a second matching unit (MU) 32 (see FIG. 1). A frequency of a high-frequency power of the second high-frequency power supply 33 is preferably in a range from 13.56 to 100 MHz, and is typically 40 MHz. The shower plate 12 and the electrodes 31 in the stage 2 form a pair of parallel plate electrodes. The shower plate 12, the electrode 31, and the second high-frequency power supply 33 constitute a second capacitively coupled plasma generation unit 40.

In the second capacitively coupled plasma generation unit 40, a high-frequency electric field is formed between the shower plate 12 and the electrode 31 by applying the high-frequency power from the second high-frequency power supply 33 to the electrode 31 of the stage 2, thereby generating a second capacitively coupled plasma between the shower plate 12 and the electrode 31. Then, the ions in the plasma are attracted to the substrate W by the application of the high-frequency bias power, so that ion-assisted etching occurs. In other words, the second capacitively coupled plasma generation unit 40 is configured as a plasma source for etching.

The second matching unit 32 matches the load impedance with an internal (or output) impedance of the second high-frequency power supply 33. The second matching unit 32 functions such that the output impedance of the second high-frequency power supply 33 and the load impedance apparently match when plasma is generated in the space between the shower plate 12 and the stage 2.

Figure 3:
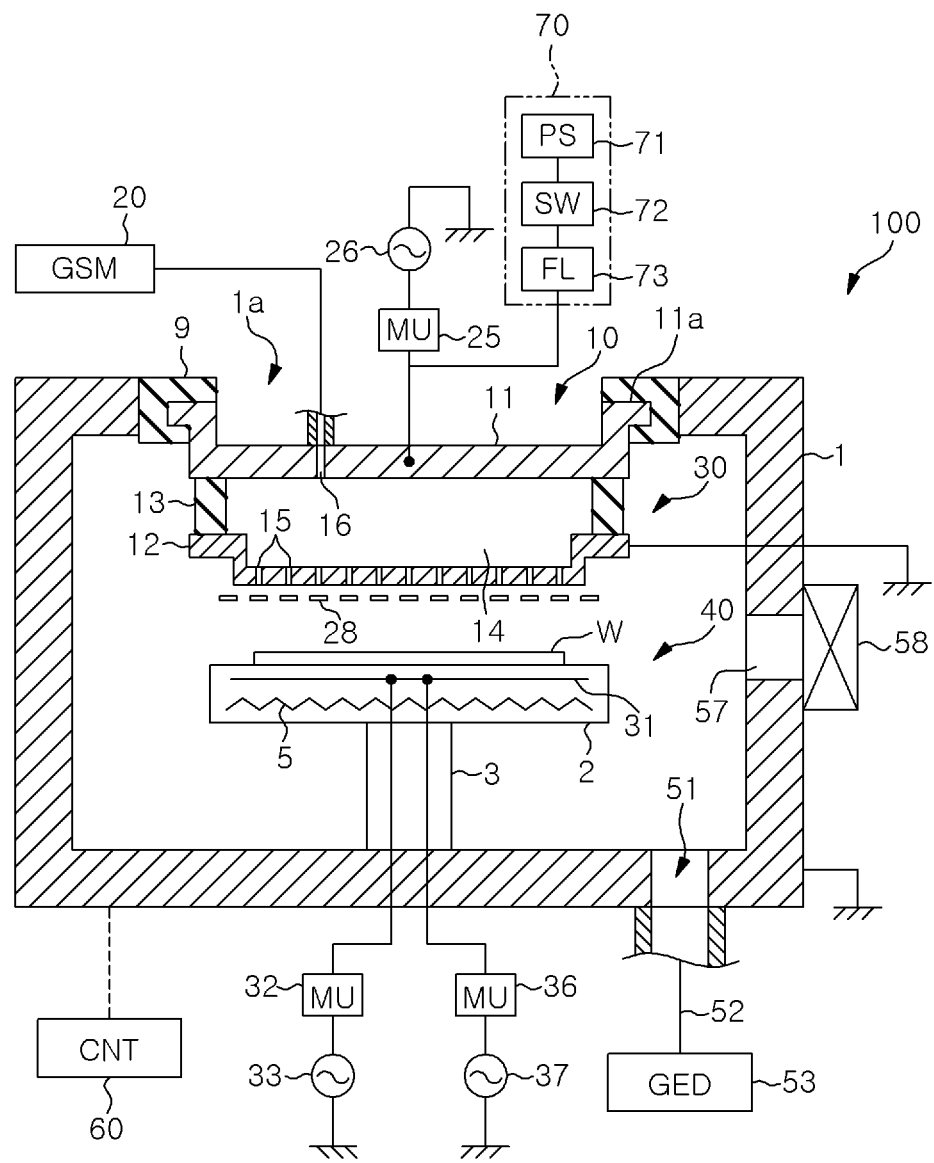
FIG. 3 is a schematic cross-sectional view showing another modification of the film-forming apparatus shown in FIG. 1.

Alternatively, as shown in FIG. 3, a third high-frequency power supply 37 may be connected to the electrode 31 through a third matching unit (MU) 36 in addition to the second high-frequency power supply 33. The third high-frequency power supply 37 is configured to apply to the substrate W a high-frequency bias power for enhancing the effects of ions by attracting ions in the plasma to the substrate W. A frequency of the high-frequency power of the third high-frequency power supply 37 is smaller than the frequency of the high-frequency power of the second high-frequency power supply 33, and is preferably in a range from 450 kHz to 13.56 MHz and is typically 13.56 MHz. The third matching unit 36 has the same function as that of the second matching unit 32.

A gas exhaust port 51 is disposed at a bottom wall of the chamber 1 and is connected to a gas exhaust line 52. A gas exhaust device (GED) 53 is connected to the gas exhaust line 52. The gas exhaust device 53 has an automatic pressure control valve and a vacuum pump. The gas exhaust device 53 is configured to maintain a pressure in the chamber 1 at a predetermined vacuum level.

Disposed on a sidewall of the chamber 1 are a loading/unloading port 57 for loading and unloading the substrate W between the chamber 1 and a vacuum transfer chamber (not shown) arranged adjacent to the chamber 1 and a gate valve 58 for opening and closing the loading/unloading port 57.

The components of the film-forming apparatus 100 such as the heater power supply, the valves, the flow rate controllers, and the high-frequency power supplies are controlled by a controller (CNT) 60. The controller 60 includes a main control unit having a computer (CPU) that controls aforementioned components. The controller 60 further includes an input device, an output device, a display device, and a storage device. The storage device is configured to store parameters of various processes executed in the film-forming apparatus 100, and a storage medium in which a program, i.e., a processing recipe, for controlling the processes executed in the film-forming apparatus 100 is stored is set in the storage device. The main control unit calls a predetermined processing recipe stored in the storage medium and controls the film-forming apparatus 100 to perform the predetermined processing based on the processing recipe.

Next, an operation of the film-forming apparatus 100 configured as described above will be described.

First, the gate valve 58 is opened, and the wafer W is loaded into the chamber 1 from the vacuum transfer chamber and placed on the stage 2 by a transfer device. After the transfer device retracts, the gate valve 58 is closed.

Next, the purge gas is continuously supplied into the chamber 1, and the inside of the chamber 1 is maintained in a predetermined pressure-reduced state by the gas exhaust device 53. The temperature of the stage 2 is controlled to a predetermined temperature by the heater 5.

Figure 4:
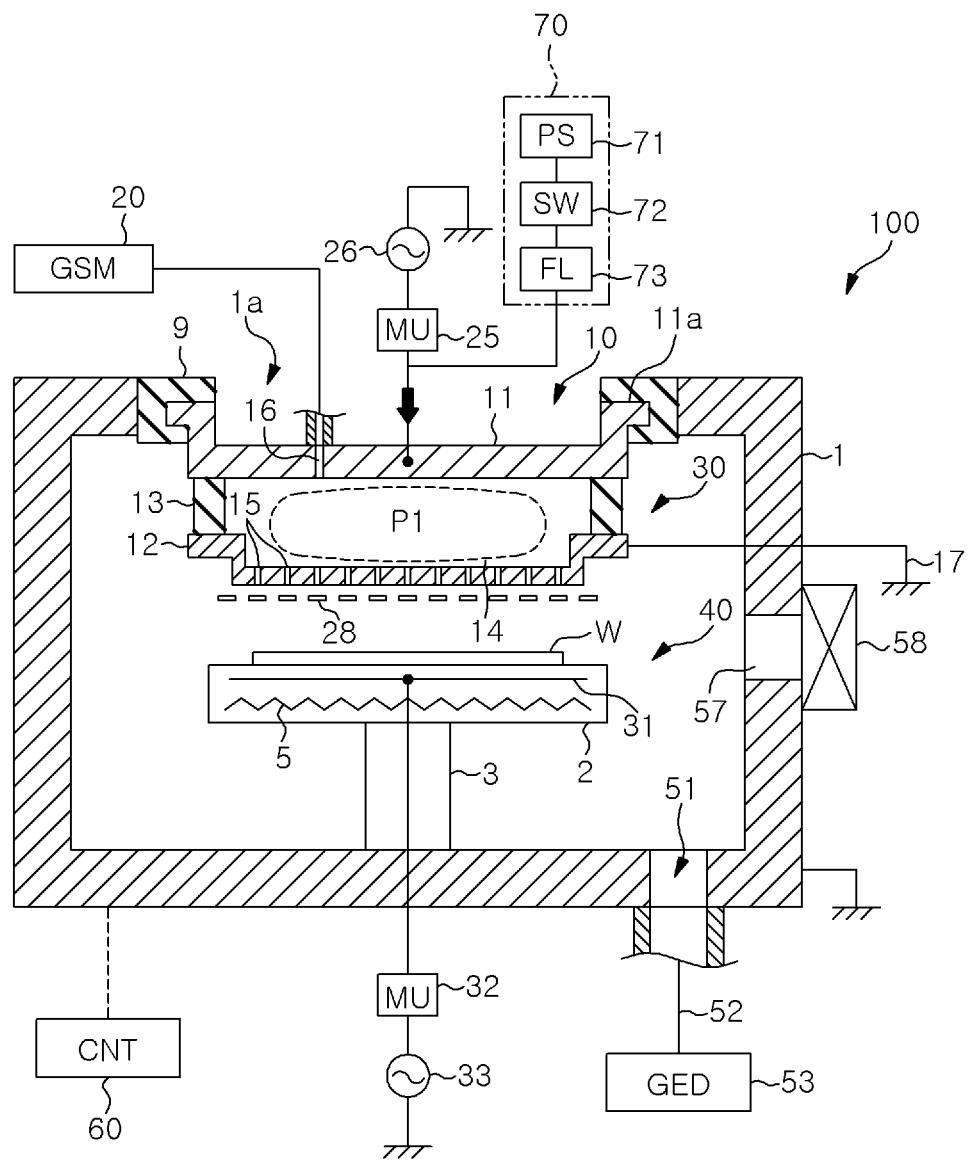
FIG. 4 is a schematic cross-sectional view showing a state in which a first capacitively coupled plasma is generated by the film-forming apparatus shown in FIG. 1.

In a state where the purge gas is continuously supplied, the film forming source gas is intermittently supplied and a first capacitively coupled plasma P1 is generated by the first capacitively coupled plasma generation unit 30 at the timing when the film forming source gas is not supplied. Thus, a predetermined film is formed by PEALD. At this plasma generation timing, as shown in FIG. 4, a high-frequency electric field is formed between the upper electrode 11 and the shower plate 12 by applying the high-frequency power from the first high-frequency power supply 26 to the upper electrode 11 of the shower head 10. Accordingly, the first capacitively coupled plasma P1 is generated in the gas diffusion space 14, and the reactant gas is dissociated by the first capacitively coupled plasma P1. The first capacitively coupled plasma P1 is generated as remote plasma, and radicals of the reactant gas that has passed through the gas injection holes 15 are mainly supplied to the substrate W on the stage 2.

Figure 5:
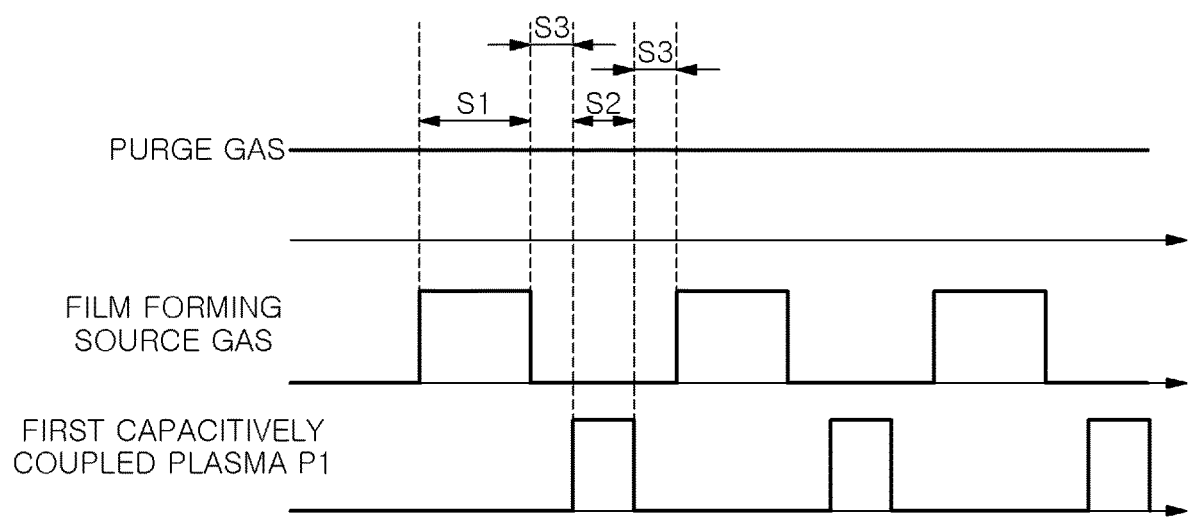
FIG. 5 is a timing chart showing a basic sequence in a case of performing PEALD using the film-forming apparatus according to the embodiment.

In PEALD, as specifically shown in FIG. 5, a step S1 of supplying the film forming source gas to the substrate is intermittently executed while continuously supplying the purge gas. Then, a step S2 of dissociating the reactant gas by the first capacitively coupled plasma P1 and supplying radicals generated by the dissociation of the reactant gas to the substrate W is intermittently executed between intermittent steps S1. Accordingly, the adsorption of the film forming source gas on the substrate W in step S1 and the supply of radicals generated by dissociation of the reactant gas in step S2 are alternately performed with a step 3 of purging the chamber 1 using the purge gas interposed therebetween. At this time, the dissociation of the reactant gas is promoted by the first capacitively coupled plasma P1, and the ions in the plasma are deactivated in the gas injection holes 15 of the shower plate 12 and further removed by the ion trap 28. Therefore, the radicals of the reactant gas are mainly supplied to the substrate W. Further, the amount of ions passing through the shower plate 12 can be controlled by the impedance adjusting circuit 21. Hence, the radicals of the reactant gas mainly react with the film forming source gas to form a predetermined film on the substrate W. Accordingly, radical-based satisfactory film formation with controlled ions or without ion damage can be realized.

As specific examples of the film to be formed, a compound film such as $SiO_2$, $TiO_2$, TiN, SiN, TaN, or BN can be formed using an oxidizing agent or a nitriding agent as the reactant gas. Further, a metal film such as Ti, Ta, W, or Si can be formed using a reducing gas such as $H_2$ gas as the reactant gas. Examples of the film forming source gas may include chloride, hydride, an organic compound, and the like.

Here, the supply of the reactant gas may be performed only at the plasma generation timing. When the reactant gas reacts with the film forming source gas only in a state where the plasma is generated, the reactant gas may be continuously supplied. For example, when the film forming source gas is $TiCl_4$ gas and the reactant gas is $O_2$ gas, a $TiO_2$ film is formed by alternately performing the supply of $TiCl_4$ gas and the generation of plasma while supplying the $O_2$ gas together with the purge gas.

Figure 6:
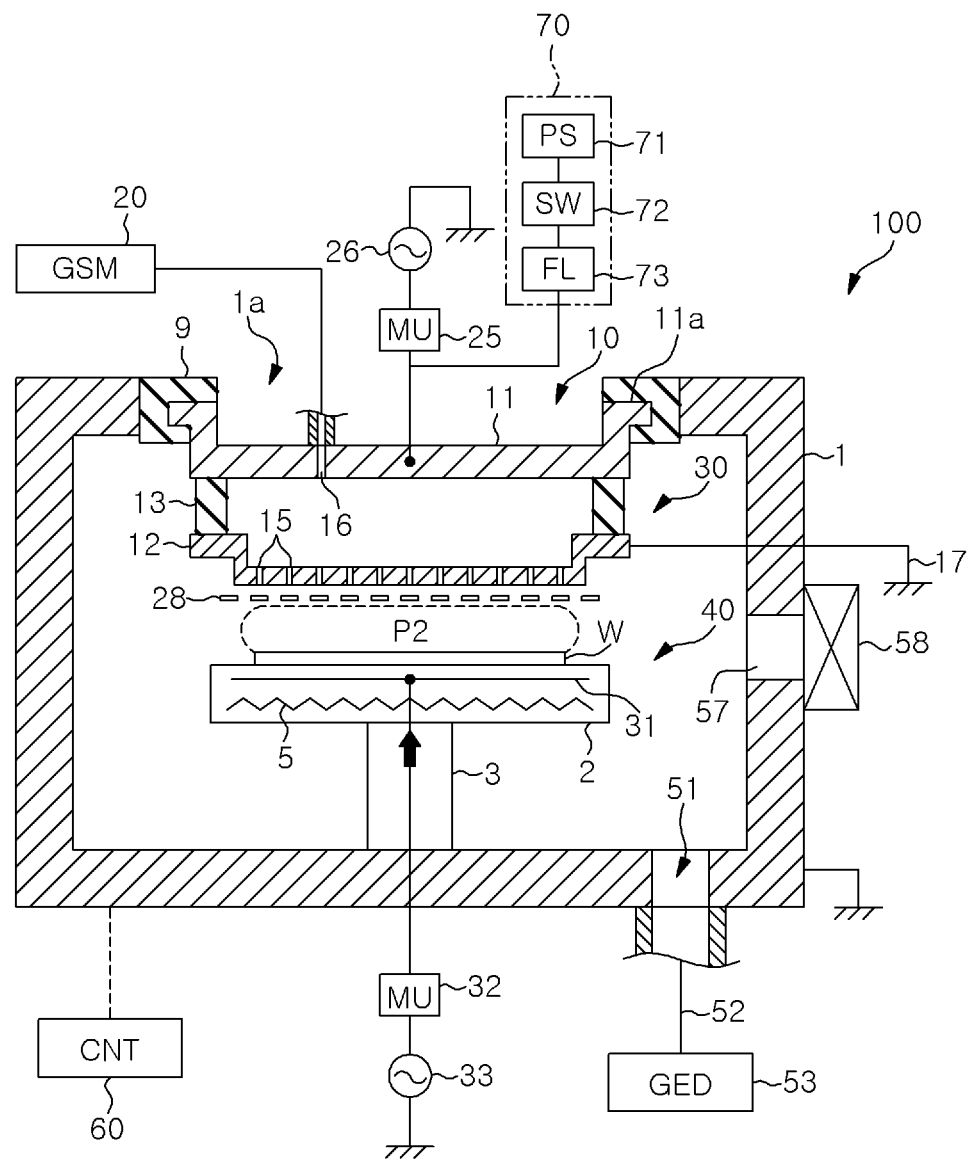
FIG. 6 is a schematic cross-sectional view showing a state in which a second capacitively coupled plasma is generated by the film-forming apparatus shown in FIG. 1.

Further, at a predetermined timing(s) during the film formation by PEALD, a step of generating plasma by the second capacitively coupled plasma generation unit 40 and performing ion-assisted etching mainly on a film formed on the substrate W is executed. At this plasma generation timing, as shown in FIG. 6, a high-frequency electric field is formed between the shower plate 12 and the electrode 31 by applying the high-frequency power from the second high-frequency power supply 33 to the electrode 31 in the stage 2. Accordingly, a second capacitively coupled plasma P2 is generated in the space between the shower plate 12 and the stage 2, and the ion-assisted etching occurs on the substrate W. Here, the shower plate 12 is an electrode facing the stage 2 (electrode 31) that is a lower electrode, and the upper electrode 11 to which the first high-frequency power is applied is not seen from the stage 2. Therefore, it is possible to stably supply the high-frequency power without depending on the first matching unit 25 disposed thereabove. In other words, the second capacitively coupled plasma P2 can be independently generated regardless of the presence of the first capacitively coupled plasma P1. The second capacitively coupled plasma P2 is generated to be in contact with the substrate W, so that efficient etching characteristics are obtained.

Due to the second capacitively coupled plasma P2, the ion-assisted etching can occur on the substrate W during the PEALD film formation, and the following effects (1) to (4) can be obtained.

(1) In the case of burying a film in a recess such as a hole or a trench, particularly in a deep hole, the conventional PEALD film formation is performed as shown in FIGS. 7A to 7C. Specifically, when a film 203 is formed by PEALD on a substrate W having a recess 202, the film may be excessively deposited at a top end opening of the recess 202 as shown in FIG. 7A. In that case, if the film formation progresses, an overhang portion 204 of the film 203 is formed at the top end opening and the top end opening is blocked. Thus, the supply of gas to a bottom portion of the recess 202 is hindered as shown in FIG. 7B. Therefore, when the burying of the film 203 in the recess 202 is completed, a void 205 may remain as shown in FIG. 7C.

Therefore, as shown in FIGS. 8A to 8C, in a state where the overhang portion 204 of the film 203 is formed as shown in FIG. 8A, the second capacitively coupled plasma P2 is generated to allow the ion-assisted etching to occur on the substrate W so that the overhang portion 204 of the film 203 is removed (see FIG. 8B). Accordingly, the supply of gas to the bottom portion of the recess 202 is not hindered, and void-free burying is realized (see FIG. 8C).

(2) Further, in the conventional PEALD film formation as shown in FIGS. 9A to 9C, in the case of burying a film 203 in a recess 202, if the film formation progresses from an initial stage of the film formation shown in FIG. 9A, the thickness of the film 203 at the upper portion of the recess 202 becomes different from the thickness of the film 203 at the bottom portion the recess 202 (see FIG. 9B), which causes stress. Therefore, when the burying of the film 203 in the recess 202 is completed, stress may occur in the film 203 (see FIG. 9C).

Therefore, as shown in FIGS. 10A to 10C, the stress is adjusted by making the film thickness uniform by allowing the ion-assisted etching using the second capacitively coupled plasma P2 to occur on the substrate W in a state where the film formation has progressed as shown in FIG. 10A (the same state as that shown in FIG. 9B) (see FIG. 10B). In this case, the film stress is reduced when the burying of the film 203 in the recess 202 is completed (see FIG. 10C).

Figure 11:
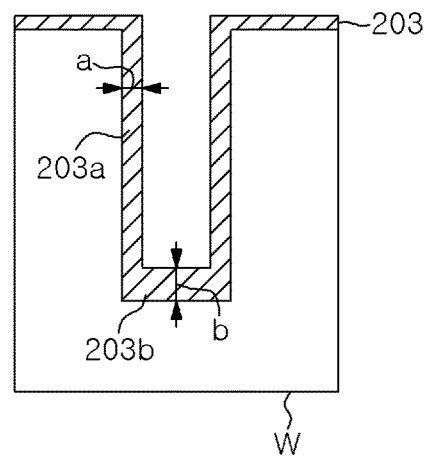
FIG. 11 is a cross-sectional view showing an example of selective film formation by PEALD using the film-forming apparatus according to the embodiment.

(3) By controlling an etching amount of the film 203 using the second capacitively coupled plasma P2, a ratio of a thickness "a" of a sidewall 203a of the film 203 and a thickness "b" of a bottom portion 203b of the film 203 can be adjusted as shown in FIG. 11. Accordingly, selective film formation can be realized.

(4) Further, by simultaneously applying the second capacitively coupled plasma P2 and the first capacitively coupled plasma P1, it is possible to control the balance between ions and radicals of the reactant gas and the etching amount. In addition, the cleavage of unnecessary components (ligands) of the film forming source gas can be promoted by the ions in the plasma. Therefore, the film formation by PEALD can be appropriately controlled.

Figure 12:
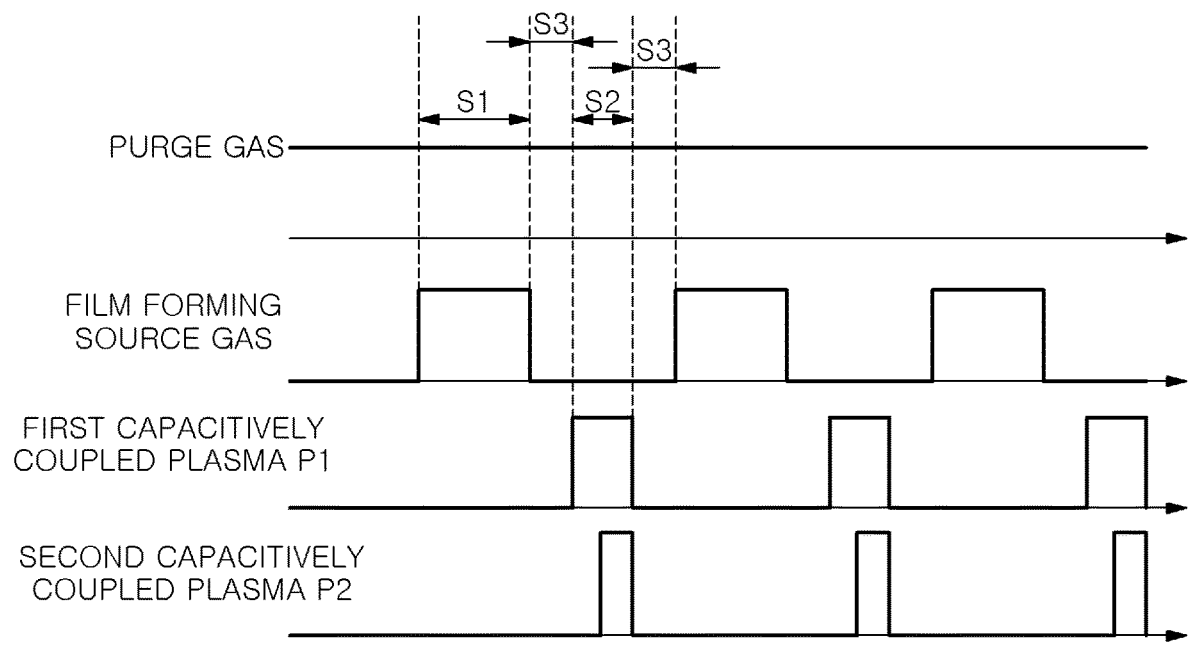
FIG. 12 is a timing chart showing an example of application timing of the first capacitively coupled plasma and the second capacitively coupled plasma.
Figure 13:
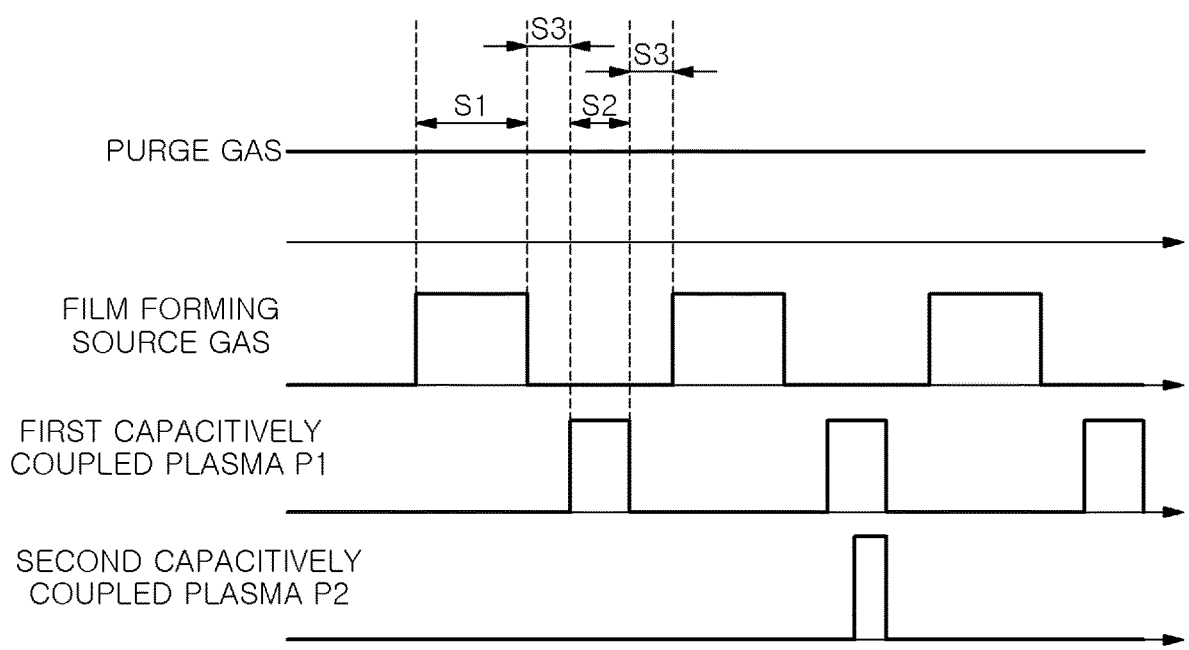
FIG. 13 is a timing chart showing another example of the application timing of the first capacitively coupled plasma and the second capacitively coupled plasma.
Figure 14:
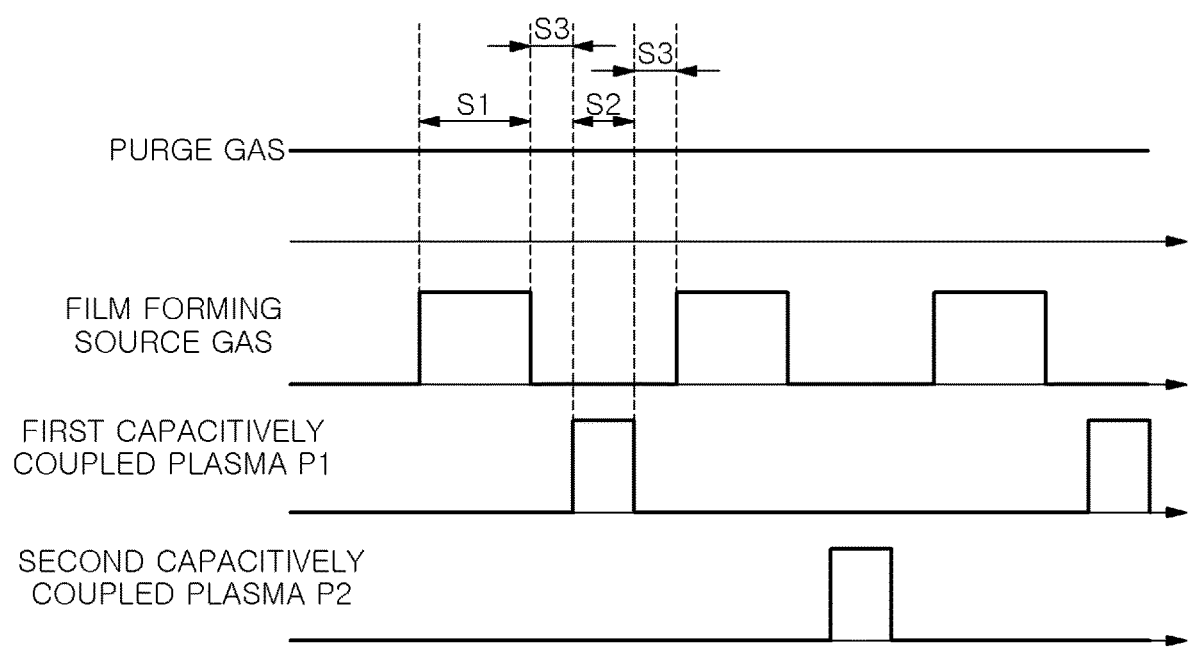
FIG. 14 is a timing chart showing still another example of the application timing of the first capacitively coupled plasma and the second capacitively coupled plasma.

FIGS. 12 to 14 show examples of the application timings of the first capacitively coupled plasma P1 and the second capacitively coupled plasma P2.

In the example of FIG. 12, a step of dissociating the reactant gas by the first capacitively coupled plasma P1 for film formation is executed at the same timing as that shown in FIG. 5. Further, at each timing of executing the step of dissociating the reactant gas by the first capacitively coupled plasma P1, a step of generating the second capacitively coupled plasma P2 for etching is executed. Accordingly, the balance of the film formation and the balance of the etching can be adjusted at the same time.

In the example of FIG. 13, a step of dissociating the reactant gas by the first capacitively coupled plasma P1 for film formation is executed at the same timing as that shown in FIG. 5. Further, a step of generating the second capacitively coupled plasma P2 for etching is executed at one or more of the timings of executing the step of dissociating the reactant gas by the first capacitively coupled plasma P1. In such a manner, the etching can be performed, for example, at a predetermined timing(s) before the top end opening of the recess is blocked.

In the example of FIG. 14, a step of dissociating the reactant gas by the first capacitively coupled plasma P1 for film formation is executed at the same timing as that shown in FIG. 5. Further, at one or more of the timings of executing the step of generating the first capacitively coupled plasma P1, a step of generating the second capacitively coupled plasma P2 for etching is executed in replacement of the step of generating the first capacitively coupled plasma P1. In other words, the step of dissociating the reactant gas by the first capacitively coupled plasma P1 and the step of generating the second capacitively coupled plasma P2 are independently carried out. Accordingly, the etching using the second capacitively coupled plasma P2 can be performed at a predetermined timing(s) during the film formation using the first capacitively coupled plasma P1, for example, before the top end opening of the recess is blocked.

As described above, the film-forming apparatus 100 of the present embodiment includes the first capacitively coupled plasma generation unit 30 and the second capacitively coupled plasma generation unit 30, each using the shower plate 12 as the facing electrode, capable of generating plasma independently. Further, as described above, the upper first capacitively coupled plasma generation unit 30 generates plasma for film formation, and the lower second capacitively coupled plasma generation unit 40 generates plasma mainly for ion-assisted etching.

Therefore, the film-forming apparatus that generates capacitively coupled plasma suitable for PEALD is provided to allow the etching to occur by controlling the amount of ions in the plasma during the PEALD film formation without complicating the apparatus configuration. Accordingly, it is possible to perform film formation while coping with the progressive miniaturization of semiconductor devices.

In the conventional PEALD film-forming apparatus disclosed in Patent Document 1, the shower head and the susceptor are used as a pair of parallel plate electrodes, and capacitively coupled plasma is generated therebetween by applying a high-frequency power to the shower head. This conventional film-forming apparatus performs film formation by PEALD through the same processes as those of the present embodiment. The capacitively coupled plasma is suitable for PEALD because it can cope with fast gas replacement in ALD and it can be quickly ignited. However, recently, devices such as a semiconductor memory and the like are much more miniaturized, so that the conventional PEALD may not be sufficient to cope with the recent trend of miniaturization.

In other words, as the miniaturization of semiconductor devices further progresses, there is a demand for techniques to achieve better burying results in a fine hole or trench, stressless and voidless burying, and selective film formation. However, it has been difficult for the conventional PEALD film-forming apparatus to cope with such a demand. Particularly, in the case where a film is buried in a fine deep hole, the PEALD may cause excessive adhesion of the film to the top end opening of the fine deep hole, which makes it difficult to form a film at a bottom portion of the fine deep hole.

Meanwhile, in order to bury a film in a fine trench, Patent Document 2 discloses the HDP-CVD method in which film formation using radicals and etching using ions are simultaneously performed by generating high-density plasma of ICP type, ECR type, or the like and applying a bias power to a substrate. In other words, the etching using ions is performed to cope with the miniaturization.

However, in the CVD described in Patent Document 2, it is difficult to perform highly controllable film formation such as ALD. Further, it is difficult for the plasma source of the ICP type or the ECR type disclosed in Patent Document to cope with PEALD because gas replacement and plasma ignition are slow.

In the case of conventional PEALD, a configuration suitable for PEALD may be realized using capacitively coupled plasma. However, the plasma generation mechanism therein is only used to dissociate the reactant gas, and does not allow the etching using ions to occur.

On the other hand, in the present embodiment, as described above, it is possible to perform film formation while coping with the progressive miniaturization of semiconductor devices by independently controlling the plasma for film formation and the plasma for etching while using the capacitively coupled plasma suitable for PEALD with a simple apparatus configuration.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

DESCRIPTION OF REFERENCE NUMERALS

1: chamber
2: stage
10: shower head
11: upper electrode
12: shower plate
13: insulating member
14: gas diffusion space
20: gas supply mechanism
26: first high-frequency power supply
30: first capacitively coupled plasma generation unit
31: electrode
33: second high-frequency power supply
40: second capacitively coupled plasma generation unit
53: gas exhaust unit
60: controller
100: film-forming apparatus
P1: first capacitively coupled plasma
P2: second capacitively coupled plasma
W: substrate

The invention claimed is:

1. A film-forming apparatus for forming a predetermined film on a substrate having a recess by plasma ALD, the film-forming apparatus comprising: a chamber accommodating a substrate; a stage supporting the substrate in the chamber; a shower head disposed to be opposed to the stage and having a conductive upper electrode and a conductive shower plate insulated from the upper electrode, the upper electrode including a gas inlet hole through which a gas including a film forming source gas for film formation and a reactant gas is supplied to a gas diffusion space between the upper electrode and the shower plate; an electrode contained in the stage; a first high-frequency power supply connected to the upper electrode; a second high-frequency power supply connected to the electrode contained in the stage; a controller; and a storage device storing a processing recipe, the processing recipe configuring the controller to: (A) supply the film forming source gas intermittently to the substrate to adsorb the film forming source gas on the substrate; (B) during a period in which the film forming source gas is not supplied, supply mainly radicals of the reactant gas to the substrate, the radicals being obtained by dissociating the reactant gas using a first capacitively coupled plasma, the first capacitively coupled plasma being generated in the gas diffusion space by supplying a high-frequency power from the first high-frequency power supply to the upper electrode, (C) form the predetermined film on the substrate by alternately performing step (A) and step (B) to react the radicals with the adsorbed film forming source gas on the substrate; and (D) at a predetermined timing during step (C), generate a second capacitively coupled plasma independently of the first capacitively coupled plasma to allow ion-assisted etching to occur on the substrate, the second capacitively coupled plasma being generated between the shower plate and the electrode in the stage by supplying a high-frequency power from the second high-frequency power supply to the electrode in the stage.

2. The film-forming apparatus of claim 1, further comprising:
a DC pulse application unit applying a DC pulse voltage to the upper electrode instead of the first high-frequency power supply or in addition to the first high-frequency power supply.

3. The film-forming apparatus of claim 1, wherein the first capacitively coupled plasma is generated as remote plasma in a gas diffusion space in the shower head, and radicals of the reactant gas that has passed through the shower plate are mainly supplied to the substrate.

4. The film-forming apparatus of claim 1, further comprising:

an ion trap disposed directly below the shower plate, wherein the ion trap removes ions in the first capacitively coupled plasma that have passed through the shower plate.

5. The film-forming apparatus of claim 1, wherein the shower plate is grounded.

6. The film-forming apparatus of claim 1, wherein the shower plate is connected to a ground line, and the film-forming apparatus further includes an impedance adjusting circuit disposed on the ground line.

7. The film-forming apparatus of claim 1, further comprising:
- a third high-frequency power supply connected to the electrode in the stage wherein the third high-frequency power supply applies a high-frequency bias power to the substrate.

* * * * *